United States Patent
Shu et al.

(10) Patent No.: US 10,411,081 B2
(45) Date of Patent: Sep. 10, 2019

(54) ORGANIC ELECTROLUMINESCENT DISPLAY PANEL, PREPARATION METHOD THEREOF, AND DISPLAY DEVICE

(71) Applicant: BOE TECHNOLOGY GROUP CO., LTD., Beijing (CN)

(72) Inventors: Shi Shu, Beijing (CN); Wei Wang, Beijing (CN); Chuanxiang Xu, Beijing (CN); Fang He, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/986,176

(22) Filed: May 22, 2018

(65) Prior Publication Data
US 2019/0123118 A1    Apr. 25, 2019

(30) Foreign Application Priority Data
Oct. 23, 2017    (CN) .......................... 2017 1 0993440

(51) Int. Cl.
| | |
|---|---|
| *H01L 27/32* | (2006.01) |
| *H01L 51/00* | (2006.01) |
| *H01L 51/56* | (2006.01) |
| *H01L 51/52* | (2006.01) |

(52) U.S. Cl.
CPC ...... *H01L 27/3258* (2013.01); *H01L 51/0017* (2013.01); *H01L 51/0018* (2013.01); *H01L 51/5237* (2013.01); *H01L 51/5253* (2013.01); *H01L 51/56* (2013.01)

(58) Field of Classification Search
CPC ............ H01L 27/3258; H01L 51/0017; H01L 51/0018; H01L 51/56; H01L 51/5237; H01L 51/5253
See application file for complete search history.

(56) References Cited

U.S. PATENT DOCUMENTS

| | | | |
|---|---|---|---|
| 2016/0035812 A1* | 2/2016 | Kwon | H01L 27/3276 257/40 |
| 2017/0331073 A1* | 11/2017 | Choi | H01L 51/0096 |
| 2018/0090517 A1* | 3/2018 | Park | H01L 27/1248 |
| 2018/0136527 A1* | 5/2018 | Park | G02F 1/136227 |
| 2019/0044092 A1* | 2/2019 | Park | H01L 51/5253 |

* cited by examiner

*Primary Examiner* — Joseph C. Nicely
(74) *Attorney, Agent, or Firm* — Kinney & Lange, P.A.

(57) ABSTRACT

Provided are an organic electroluminescent display panel, a preparation method thereof, and a display device. In the organic electroluminescent display panel provided in the present disclosure, an etching layer comprising at least a convex with a narrow upper portion and a wide upper portion is disposed between a base substrate and a plurality of display components, wherein a top surface of the convex is in an display area of the base substrate, a display component on an edge of the display area of the base substrate extends beyond the convex, and an inorganic film of a thin film encapsulation structure is broken at a tip of the display component extending beyond the convex.

20 Claims, 6 Drawing Sheets

Before cutting → After cutting

ORGANIC ELECTROLUMINESCENT DISPLAY PANEL, PREPARATION METHOD THEREOF, AND DISPLAY DEVICE

CROSS REFERENCE TO RELATED APPLICATION

The present application claims a priority benefit of Chinese Patent Application No. 201710993440.5, filed on Oct. 23, 2017, the entire contents thereof being incorporated herein by reference.

TECHNICAL FIELD

The present disclosure relates to the technical field of display, and particularly to an organic electroluminescent display panel, a preparation method thereof, and a display device.

BACKGROUND

With the progress of display technologies, more and more active matrix organic light emitting diode (AMOLED) display panels enter the market. In comparison with conventional thin film transistor liquid crystal displays (TFT LCDs), AMOLED display panels have advantages of low energy consumption, low production cost, self-luminescence, wide view angle, rapid response rate and the like. Currently, conventional LCD display screens have been displaced gradually by organic light emitting diode (OLED) display panels in the display areas such as mobile phone, personal digital assistant (PDA), digital camera and the like.

SUMMARY

An embodiment of the present disclosure provides an organic electroluminescent display panel, including: a base substrate; a plurality of display components on a display area of the base substrate; an etching layer between the base substrate and the plurality of display components; and a thin film encapsulation structure covering the display area and a peripheral area of the base substrate, wherein, the etching layer includes a convex with a narrow upper portion and a wide lower portion, a top surface of the convex being in the display area of the base substrate; a display component on an edge of the display area of the base substrate extends beyond the convex; and the thin film encapsulation structure includes at least one layer of inorganic film and at least one layer of organic film disposed alternatively; the organic film only covers the plurality of display components; the inorganic film covers the entire base substrate, but is broken at a tip of the display component extending beyond the convex.

Optionally, in a direction perpendicular to the base substrate, a distance between the tip of the display component extending beyond the convex and a closest film layer on a side of the display component close to the base substrate is greater than a sum of thicknesses of all inorganic films.

Optionally, a shortest distance between the convex and an edge of the base substrate is not less than a distance between the tip of the display component extending beyond the convex and the edge of the base substrate.

Optionally, the etching layer further includes a main body part covering the entire base substrate, wherein the main body part is closer to the base substrate than the convex.

Optionally, the main body part and the convex are formed integrally.

Optionally, the organic electroluminescent display panel further includes: a thin film transistor array between the base substrate and the plurality of display components, wherein an electrode in the display components is connected to the thin film transistor, and an insulating layer in the thin film transistor is also used as the etching layer.

Optionally, the thin film transistor includes: an active layer, a gate electrode insulating layer, a gate electrode, an interlayer insulating layer, and source/drain electrodes sequentially disposed on the base substrate; wherein the interlayer insulating layer is also used as the etching layer.

Optionally, the thin film transistor includes: an active layer, a gate electrode insulating layer, a gate electrode, an interlayer insulating layer, and source/drain electrodes sequentially disposed on the base substrate; wherein the interlayer insulating layer and the gate electrode insulating layer are also used as the etching layer.

Optionally, the plurality of display components include: a flatten layer, and a pixel defining layer and a pixel unit on the flatten layer, wherein the pixel unit includes an anode, a cathode and an organic electroluminescent unit between the anode and the cathode.

Optionally, the plurality of display components further include a post spacer layer on the pixel defining layer.

An embodiment of the present disclosure further provides a display device including the organic electroluminescent display panel provided in any embodiment of the present disclosure.

An embodiment of the present disclosure further provides a preparation method for the organic electroluminescent display panel provided in any embodiment of the present disclosure, including: forming an etching film on a display area and a peripheral area of a base substrate; forming a plurality of display components on the etching film in the display area of the base substrate, and after forming a flatten layer in the display components, dry etching the etching film to form an etching layer including a convex with a narrow upper portion and a wide lower portion, wherein a top surface of the convex is in the display area of the base substrate, and a display component on an edge of the display area of the base substrate extends beyond the convex; and forming a thin film encapsulation structure on the display area and the peripheral area of the base substrate, wherein the thin film encapsulation structure includes at least one layer of inorganic film and at least one layer of organic film disposed alternatively, the organic film only covers the plurality of display components, the inorganic film covers the entire base substrate, but is broken at a tip of the display component extending beyond the convex.

Optionally, said dry etching the etching film to form the etching layer including one convex with the narrow upper portion and the wide lower portion includes: dry etching the etching film to form the etching layer including the convex with the narrow upper portion and the wide lower portion, such that in a direction perpendicular to the base substrate, a distance between the tip of the display component extending beyond the convex and a closest film layer on a side of the display component close to the base substrate is greater than a sum of thicknesses of all inorganic films.

Optionally, said dry etching the etching film to form the etching layer including the convex with the narrow upper portion and the wide lower portion includes: dry etching the etching film to form the etching layer including the convex with the narrow upper portion and the wide lower portion and a main body part covering the entire base substrate;

wherein the main body part is closer to the base substrate than the convex, and the main body part and the convex are formed integrally.

Optionally, said forming the flatten layer in the display components, followed by dry etching the etching film to form the etching layer including the convex with the narrow upper portion and the wide lower portion includes: after forming a post spacer layer in the display components, dry etching the etching film with the post spacer layer as a mask to form the etching layer including the convex with the narrow upper portion and the wide lower portion.

Optionally, the preparation method further includes: forming a thin film transistor array between the base substrate and the plurality of display components, wherein an electrode in the display components is connected to the thin film transistor, and an insulating layer in the thin film transistor is also used as the etching layer.

Optionally, the thin film transistor includes: an active layer, a gate electrode insulating layer, a gate electrode, an interlayer insulating layer, and source/drain electrodes sequentially disposed on the base substrate; wherein the interlayer insulating layer is also used as the etching layer.

Optionally, the thin film transistor includes: an active layer, a gate electrode insulating layer, a gate electrode, an interlayer insulating layer, and source/drain electrodes sequentially disposed on the base substrate; wherein the interlayer insulating layer and the gate electrode insulating layer are also used as the etching layer.

Optionally, process conditions for the dry etching include: power: 800 to 1500 W, pressure: 800 to 1200 mtorr, $SF_6$: 30 to 260 sccm, $Cl_2$: 10 to 80 sccm, He: 0 to 20 sccm, and duration: 200 to 700 s.

Optionally, said forming the thin film encapsulation structure on the display area and the peripheral area of the base substrate includes: forming an inorganic film on the entire base substrate, the inorganic film being broken at a tip of the display component extending beyond the convex; and forming an organic layer covering the plurality of display components on the base substrate.

DETAILED DESCRIPTION

Because OLED devices are sensitive to water, oxygen, and temperature, thin film encapsulation is a critical process for an OLED display panel, which directly influences the defect rate and reliability of the OLED display panel. A thin film encapsulation structure usually includes at least one layer of inorganic film and at least one layer of organic film disposed alternatively, wherein, the inorganic film covers the entire base substrate of the OLED display panel. When cutting the OLED display panel with a cutting wheel, a crack due to the embrittlement of the inorganic film on the cutting line may propagate outwards from an edge of the OLED display panel to a display area (AA area). An inorganic film crack in the AA area may cause the failure of the display component due to the influence of water and oxygen, so "no good" (NG) may occur in a reliability test. In addition, a crack generated during transportation may also propagate to the display area, which causes the failure of the display component due to the influence of water and oxygen.

Figure 1:
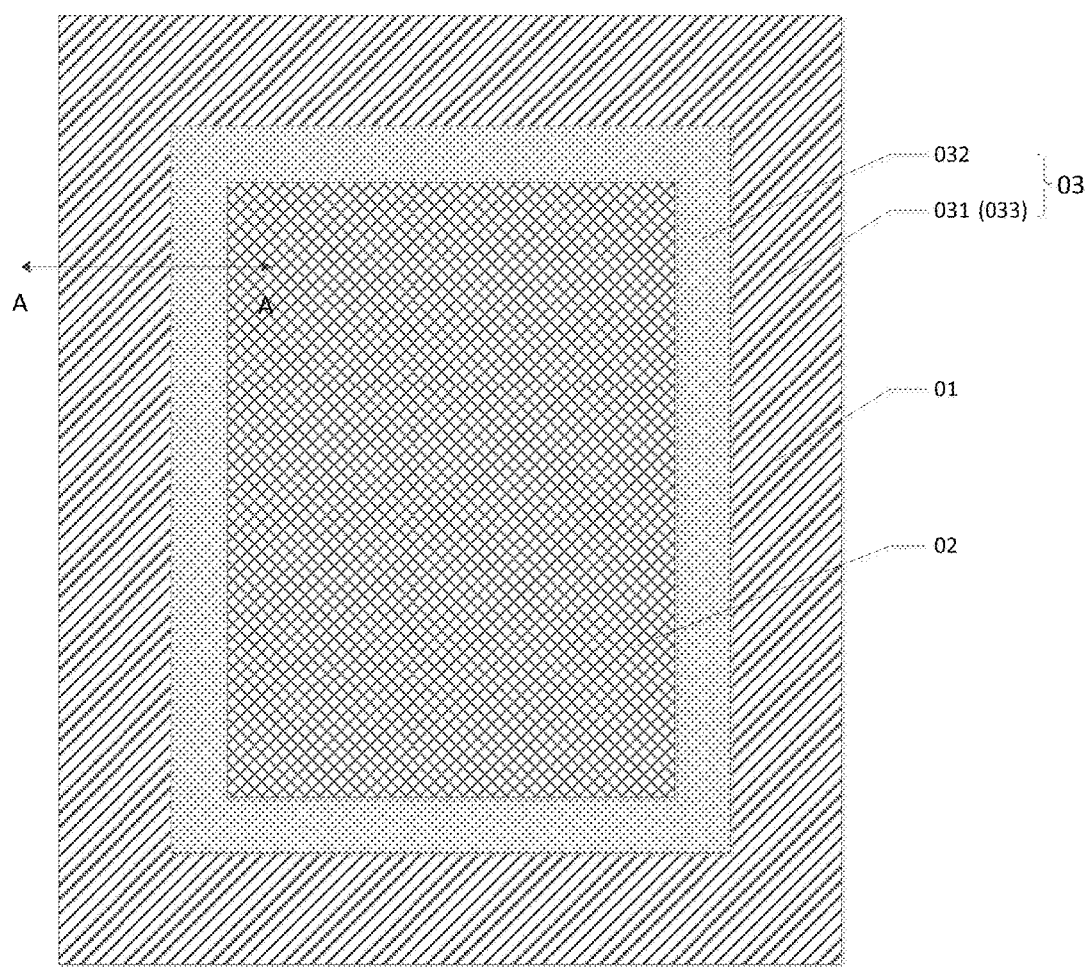
FIG. 1 is a schematic top view of an organic electroluminescent display panel in relevant technology.
Figure 2:
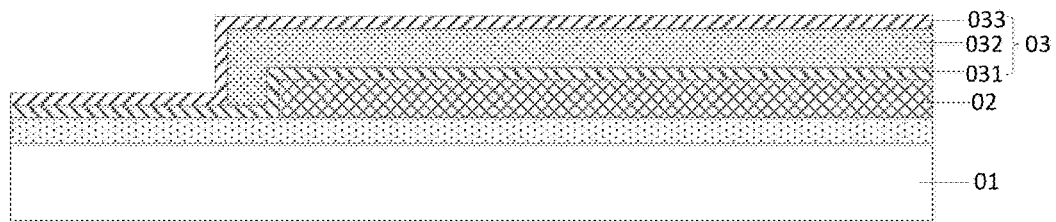
FIG. 2 is a schematic sectional view along line A-A in FIG. 1.

As shown in FIGS. 1 and 2, a thin film encapsulation structure 03 covering a display component 02 is usually disposed on a base substrate 01. The thin film encapsulation structure 03 is generally composed of three layers, i.e., a first inorganic film 031, an organic film 032, and a second inorganic film 033, respectively. Here, the first inorganic film 031 and the second inorganic film 033 have a certain hardness, and can effectively prevent water and oxygen from entering into the display component 02, to prevent the OLED device from failure. However, since the thickness of the inorganic film is relatively thin, e.g., less than 1 μm, the inorganic film cannot enwrap tiny particles, which may cause the failure of the encapsulation. The organic film 032 has a thickness of about 6 μm to 10 μm, can cover and enwrap some fine particles, and has a better flexibility, which can increase the flexibility of the thin film encapsulation structure 03 and prevent the crack from propagating from the exterior to the interior of the inorganic film to cause the failure of the encapsulation. However, the organic film 032 does not have a water-proof property, so a second inorganic film 033 is needed to encapsulate the organic film 032. Here, the first inorganic film 031 and the second inorganic film 033 may be one of $SiN_x$, SiCN, SiON and $SiO_x$ or a combination thereof. The organic film 032 may be polytetrafluoroethylene (TFE) or the like.

Figure 3:
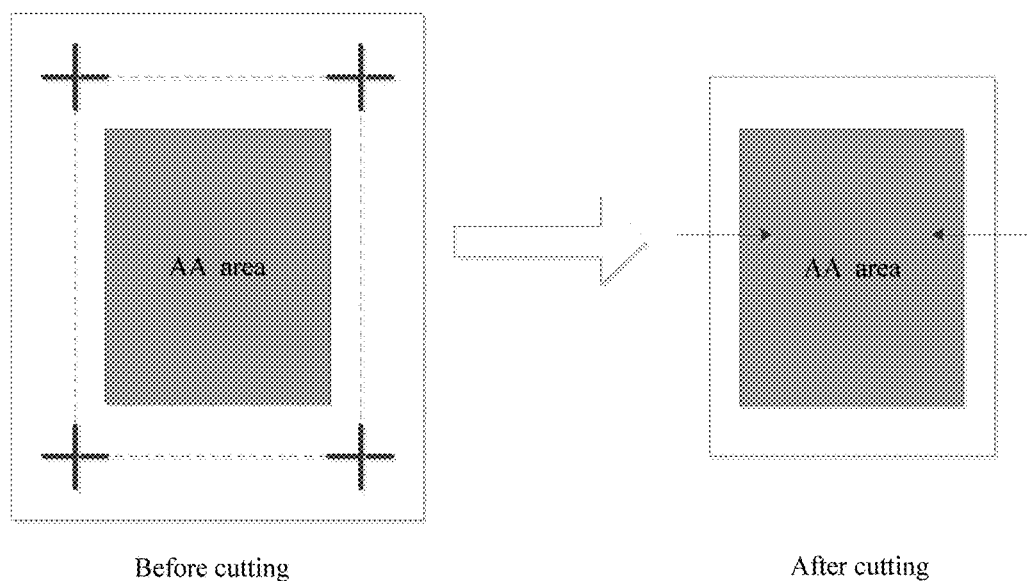
FIG. 3 is a schematic diagram showing the crack propagation generated when cutting an OLED display panel in relevant technology.

Particularly, the first inorganic film 031 and the second inorganic film 033 are generally formed by a chemical vapor deposition (CVD) process, and cover the entire base substrate 01, while the organic film 032 is generally formed by a printing process, and only covers the display component 02. Since the first inorganic film 031 and the second inorganic film 033 cover the entire base substrate 01, a crack generated during the cutting or transportation of the panel will propagate from the first inorganic film 031 and the second inorganic film 033 to the center of the display component 02, resulting in failure of encapsulation. For example, the propagation procedure of a crack generated when cutting an OLED display panel is shown in FIG. 3. The arrows in FIG. 3 indicate the crack propagation directions, and the dashed lines in FIG. 3 represent the cutting lines.

Therefore, it is an urgent technical problem to be solved by those skilled in the art how to prevent a crack generated during the cutting or transportation of an OLED display panel from propagating to a display area, thereby improving the reliability of product.

Some technical solutions in the embodiments of the present disclosure will be described below with reference to FIGS. 4 to 8. Obviously, the embodiments described are only a part of, but not all of the embodiments of the present disclosure. All of other embodiments obtained by those skilled in the art based on the embodiments of the present disclosure, without inventive efforts, fall within the protective scope of the present application.

It should be noted that the thickness and shape of each layer in the drawings of the present disclosure do not indicate a practical proportion, and are only intended to schematically illustrate the present disclosure.

Figure 4:
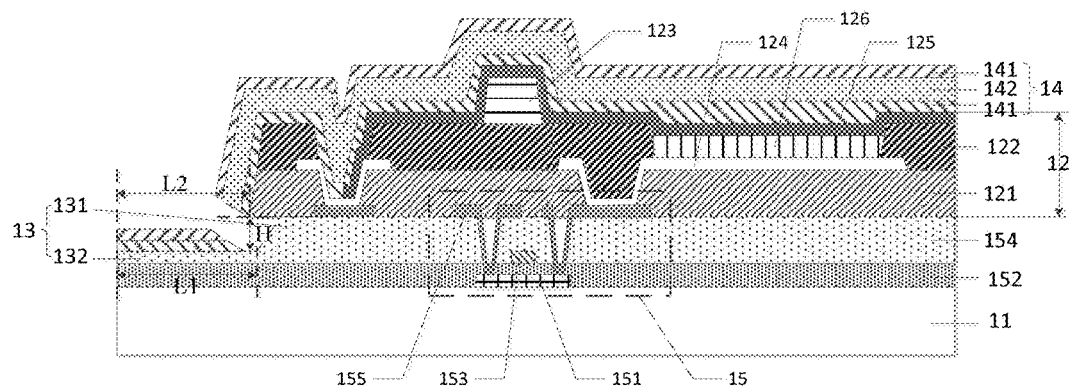
FIG. 4 is a structural schematic diagram of an organic electroluminescent display panel provided in an embodiment of the present disclosure.

As shown in FIG. 4, an organic electroluminescent display panel provided in one embodiment of the present disclosure includes: a base substrate 11, a plurality of display components 12 on a display area of the base substrate 11 (the display area of the base substrate corresponds to a projection of an area in the display panel for disposing the display components on the base substrate), an etching layer 13 between the base substrate 11 and the plurality of display components 12, and a thin film encapsulation structure 14 covering the display area and a peripheral area of the base substrate 11.

The etching layer 13 includes one convex 131 with a narrow upper portion and a wide lower portion, a top surface of the convex 131 being in the display area of the base substrate 11; and the display component 12 on an edge of the display area of the base substrate 11 extends beyond the convex 131 (extending outwards beyond the convex 131 from the top surface of the convex 131). All display components 12 on the edge of the display area of the base substrate 11 may extend beyond the convex 131.

The thin film encapsulation structure 14 includes at least one layer of inorganic film 141 and at least one layer of organic film 142; the organic film 142 only covers the plurality of display components 12; the inorganic film 141 covers the entire base substrate 11, but is broken at a tip (the outermost end) of the display component 12 extending beyond the convex 131.

In the thin film encapsulation structure 14 as shown in FIG. 4, the thin film encapsulation structure 14 includes two layers of inorganic films 141 and one layer of organic film 142 between them. However, the present disclosure is not limited thereto. For example, the thin film encapsulation structure 14 may include three layers of inorganic films 141 and two layers of organic films 142, i.e., a five-layer structure of inorganic film 141/organic film 142/inorganic film 141/organic film 142/inorganic film 141. Optionally, the thin film encapsulation structure 14 may also include one layer of inorganic film 141 and one layer of organic film 142, i.e., a two-layer structure of inorganic film 141/organic film 142.

In the above organic electroluminescent display panel provided in the embodiments of the present disclosure, an etching layer 13 including at least a convex 131 with a narrow upper portion and a wide upper portion is disposed between a base substrate 11 and a plurality of display components 12, wherein a top surface of the convex 131 is in a display area of the base substrate 11, display components 12 on an edge of the display area of the base substrate 11 extend beyond the convex 131, and an inorganic film 141 is configured to be broken at a tip of the display component 12 extending beyond the convex 131. As such, the crack generated during the cutting or transportation of an OLED display panel can be prevented from propagating to the display area, and as a result, the failure of the display component due to the influence of water and oxygen is avoided, which improves the reliability of the product.

In one optional embodiment, as shown in FIG. 4, in a direction perpendicular to the base substrate 11, a distance H between the tip of the display component 12 extending beyond the convex 131 and a closest film layer on a side of the display component 12 close to the base substrate 11 is greater than a sum of thickness of each of the inorganic films 141 (in case of a single layer inorganic film 141, greater than the thickness of the single layer inorganic film 141, or in case of multiple layers of inorganic films 141, greater than the total thickness of all inorganic films). As such, it allows the inorganic films 141 to be broken at the tip of the display component 12 extending beyond the convex 131, so that the crack generated during the cutting or transportation of an OLED display panel can be prevented from propagating to the display area, which avoids the failure of the display component due to the influence of water and oxygen, and improves the reliability of the product.

In one optional embodiment, as shown in FIG. 4, a shortest distance L1 between the convex 131 and an edge of the base substrate 11 is not less than a distance L2 between the tip of the display component 12 extending beyond the convex 131 and the edge of the base substrate 11. That is, a projection of the convex 131 on the base substrate 11 is within a projection of the plurality of display components 12 on the base substrate 11. In this manner, the distance between the tip of the display component 12 extending beyond the convex 131 and the closest film layer on the side of the display component 12 close to the base substrate 11 is equal to the thickness of the convex 131. When forming the etching layer 13 including the convex 131 by a dry etching process, the depth required to be dry etched is relatively small, which can reduce the fabrication time.

Figure 5:
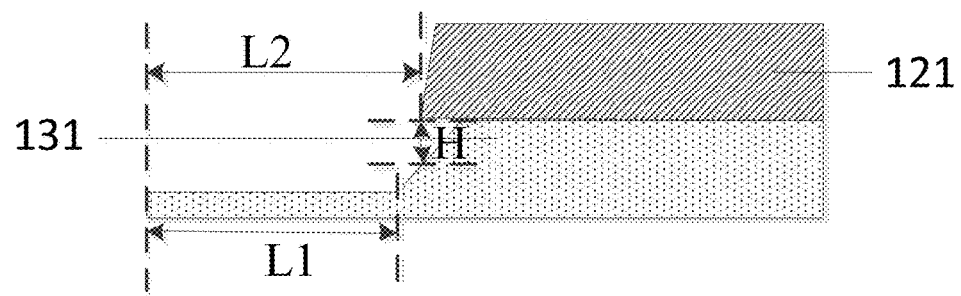
FIG. 5 is a schematic diagram showing the relative position relationship between the flatten layer in the display components and the etching layer in the organic electroluminescent display panel provided in an embodiment of the present disclosure.

Of course, the shortest distance L1 between the convex 131 and the edge of the base substrate 11 may also be configured to be less than the distance L2 between the tip of the display component 12 extending beyond the convex 131 and the edge of the base substrate 11. At this time, the distance H between the tip of the display component 12 extending beyond the convex 131 and the closest film layer on the side of the display component 12 close to the base substrate 11 is less than the thickness of the convex 131, as shown in FIG. 5. This is not limited in the embodiments of the present disclosure.

In a particular implementation, in the above organic electroluminescent display panel provided in the embodiments of the present disclosure, the thin film encapsulation structure 14 may include only one layer of inorganic film 141 and one layer of organic film 142. At this time, the organic film 142, for example, may be closer to the display components 12 than the inorganic film 141, such that the organic film 142 achieves functions of covering and enwrapping some fine particles, and the upper inorganic film 141 may cover and encapsulate the organic film 142 to achieve a water and oxygen barrier effect.

In one optional embodiment, as shown in FIG. 4, in the above organic electroluminescent display panel provided in the embodiments of the present disclosure, the thin film encapsulation structure 14 includes two layers of inorganic films 141 and one layer of organic film 142. The two layers of inorganic films 141 can have a better water and oxygen barrier effect, and the organic film 142 also can achieve good flexibility.

Of course, in particular implementation, more than two layers of inorganic films 141 may be fabricated, and this is not limited here.

In one optional embodiment, as shown in FIG. 4, the display components 12 may include: a flatten layer 121, a pixel defining layer 122 for defining a pixel unit disposed on the flatten layer 121, and a post spacer layer 123 disposed on the pixel defining layer 122; an anode 124, a cathode 125 and an organic electroluminescent unit 126 between the anode 124 and the cathode 125 are disposed in each pixel unit.

Figure 6:
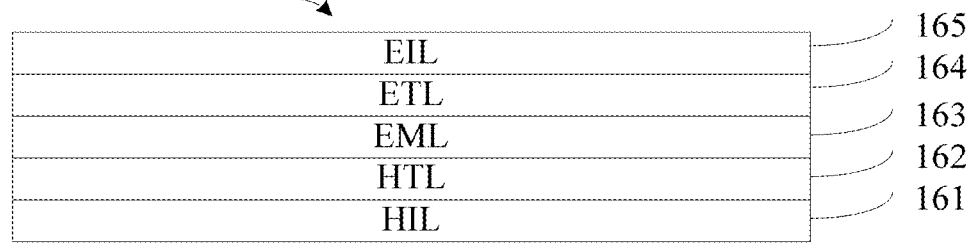
FIG. 6 is a structural schematic diagram of the organic electroluminescent unit in the organic electroluminescent display panel provided in an embodiment of the present disclosure.

In one optional embodiment, the organic electroluminescent unit 126 may include the following layers sequentially from the anode 124 side to the cathode 125 side: a hole injection layer (HIL) 161, a hole transport layer (HTL) 162, a light-emitting layer (EML) 163, an electron transport layer (ETL) 164, and an electron injection layer (EIL) 165, as shown in FIG. 6.

Of course, the organic electroluminescent unit 126 may also have other structures. For example, the organic electroluminescent unit 126 may include: a hole transport layer, a light-emitting layer, and an electron transport layer. The organic electroluminescent unit 126 may have any structure, and this is not limited in the embodiments of the present disclosure.

The above etching layer 13 may include only the convex 131 with the narrow upper portion and the wide lower portion. In one optional embodiment, as shown in FIG. 4, the etching layer 13 may also include a main body part 132 covering the entire base substrate 11; the main body part 132 is closer to the base substrate 11 than the convex 131. This is not limited in the embodiments of the present disclosure.

In one optional embodiment, as shown in FIG. 4, the main body part 132 and the convex 131 may be configured to be formed integrally; of course, they may not be formed integrally; and this is not limited here.

In one optional embodiment, as shown in FIG. 4, the above organic electroluminescent display panel further includes: a thin film transistor 15 array disposed between the base substrate 11 and the plurality of display components 12; and the thin film transistor 15 is connected to an electrode in the display components 12, for driving the display components 12. Particularly, the thin film transistor 15 may be connected to anode 124 in the display components 12. In order to simplify the process, the insulating layer in the thin film transistor 15 may also be used as the etching layer 13 (i.e., the insulating layer in the thin film transistor 15 and the etching layer 13 are the same layer); of course, the etching layer 13 may also be a film layer specifically used for breaking the inorganic film 141; and this is not limited here.

In one optional embodiment, as shown in FIG. 4, the thin film transistor 15 includes: an active layer 151, a gate electrode insulating layer 152, a gate electrode 153, an interlayer insulating layer 154 and source/drain electrodes 155 sequentially disposed on the base substrate 11.

The interlayer insulating layer 154 may also be used as the above etching layer 13 (i.e., the etching layer 13 is the interlayer insulating layer 154 in the thin film transistor 15), as shown in FIG. 4, or the interlayer insulating layer 154 and the gate electrode insulating layer 152 may also be used as the above etching layer 13 (i.e., the etching layer 13 includes the interlayer insulating layer 154 and the gate electrode insulating layer 152). In particular implementation, this can be configured according to practical requirement, and is not limited here.

It should be noted that in the organic electroluminescent display panel provided in the embodiments of the present disclosure, the display components and the thin film transistor may have any structure, and this is not limited in the embodiments of the present disclosure.

In particular implementation, the above organic electroluminescent display panel provided in the embodiments of the present disclosure may be fabricated into a flexible display device. At this time, it is required to use a flexible base substrate, which may be formed by using any suitable insulating layer having a flexibility, as the base substrate 11. For example, the flexible base substrate may be formed from a polymer material such as polyimide (PI), polycarbonate (PC), polyether sulfone (PES), polyethylene terephthalate (PET), polyethylene naphthalenedicarboxylate (PEN), polyaryl compound (PAR), thin film fiber reinforced plastics (FRP) or the like. The flexible base substrate may be transparent, translucent, or opaque, and this is not limited here.

Figure 7:
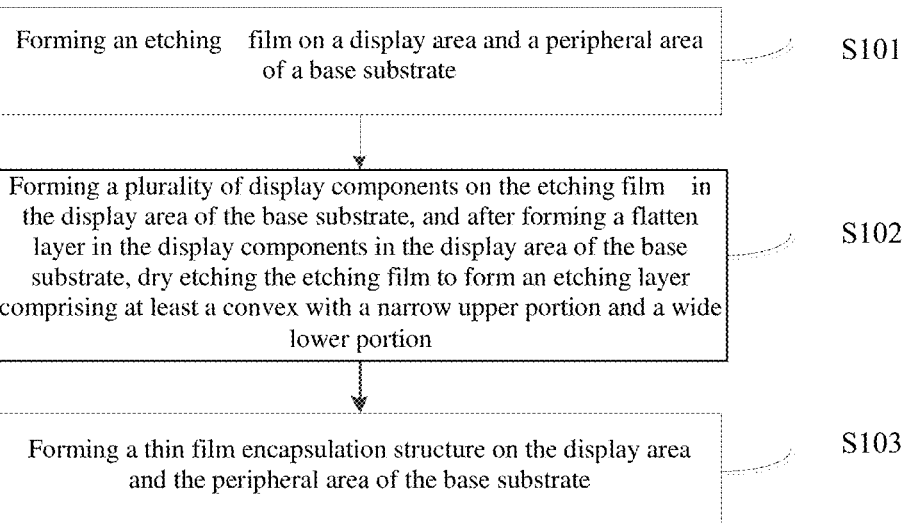
FIG. 7 is a flow chart of a preparation method for the organic electroluminescent display panel provided in an embodiment of the present disclosure.

Base on the same concept, as shown in FIG. 7, an embodiment of the present disclosure further provides a preparation method for the above organic electroluminescent display panel, including the following steps:

S101: forming an etching film on a display area and a peripheral area of a base substrate;

S102: forming a plurality of display components on the etching film in the display area of the base substrate, and after forming a flatten layer in the display components, dry etching the etching film to form an etching layer including a convex with a narrow upper portion and a wide lower portion, wherein a top surface of the convex is in the display area of the base substrate, and a display component on an edge of the display area of the base substrate extends beyond the convex; and S103: forming a thin film encapsulation structure on the display area and the peripheral area of the base substrate, wherein the thin film encapsulation structure includes at least one layer of inorganic film and at least one layer of organic film disposed alternatively, the organic film only covers the plurality of display components, the inorganic film covers the entire base substrate, but is broken at a tip of the display component extending beyond the convex.

In the above method, for example, when forming the etching layer in Step S102, the convex may be formed in such a manner that in a direction perpendicular to the base substrate, a distance between the tip of the display component extending beyond the convex and a closest film layer on a side of the display component close to the base substrate is greater than a sum of thicknesses of all inorganic films, to allow the inorganic films to be broken at the tip of the display component extending beyond the convex in Step S103.

In one optional embodiment, in Step S102, after forming the flatten layer in the display components, dry etching the etching film to form the etching layer including the convex with the narrow upper portion and the wide lower portion may particularly include: after forming a post spacer layer in the display components, dry etching the etching film with the post spacer layer as a mask to form the etching layer including the convex with the narrow upper portion and the wide lower portion.

In one optional embodiment, the post spacer layer is disposed on the pixel defining layer.

In the above method, the etching film is dry etched after the post spacer layer in the display components is formed, such that the influence of dry etching on the display components can be reduced as much as possible.

It should be noted that the step of dry etching the etching film to form the etching layer may be performed following any step after forming the flatten layer in the display components and before forming the thin film encapsulation structure, and this is not limited here, although it may cause a certain influence on the display components if the dry etching step is performed before forming the post spacer layer in the display components.

In one optional embodiment, in Step S102, dry etching the etching film to form the etching layer including the convex with the narrow upper portion and the wide lower portion may particularly include: dry etching the etching film to form the etching layer including the convex with the narrow upper portion and the wide lower portion and a main body part covering the entire base substrate; wherein the main body part is closer to the base substrate than the convex, and the main body part and the convex are formed integrally.

In one optional embodiment, in Step S103, forming the thin film encapsulation structure on the display area and the peripheral area of the base substrate may particularly include: forming an inorganic film on the entire base substrate by a chemical vapor deposition process, the inorganic film being broken at a tip of the display component extending beyond the convex; and forming an organic layer covering the plurality of display components on the base substrate by a printing process.

The preparation process flow for the organic electroluminescent display panel provided in the embodiments of the present disclosure is described in detail below with reference to FIGS. 8a to 8d, using the structure of the organic electroluminescent display panel as shown in FIG. 4 as an example.

Figure 8A:
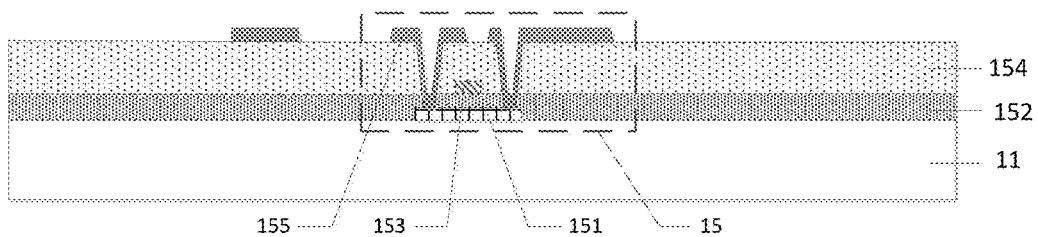
FIGS. 8a to 8d are schematic diagrams showing a preparation process flow for the organic electroluminescent display panel provided in an embodiment of the present disclosure.

Step I: as shown in FIG. 8a, fabricating a thin film transistor 15 on a base substrate 11; wherein, the thin film transistor 15 includes: an active layer 151, a gate electrode insulating layer 152, a gate electrode 153, an interlayer insulating layer 154 and source/drain electrodes 155 sequentially disposed on the base substrate 11.

Figure 8B:
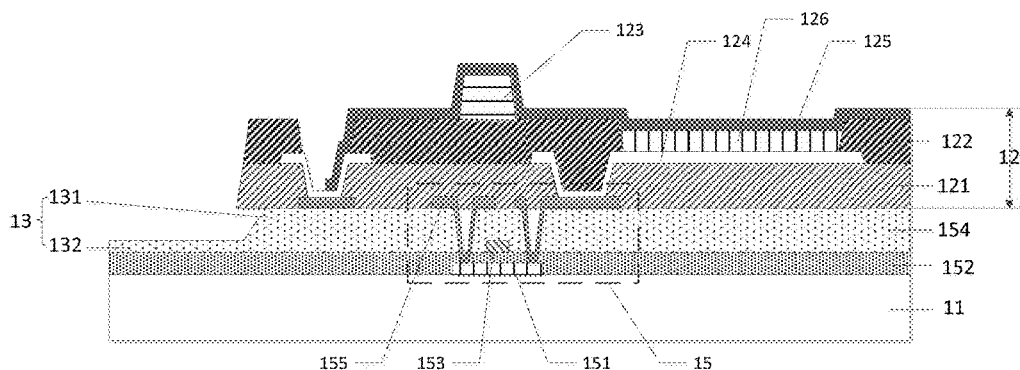

Step II: as shown in FIG. 8b, forming a plurality of display components 12 on the thin film transistor 15 in a display area of the base substrate 11, and after forming a post spacer layer 123 in the display components 12, dry etching the interlayer insulating layer 154 in the thin film transistor 15 to form an etching layer 13 including a convex 131 with a narrow upper portion and a wide lower portion and a main body part 132 covering the entire base substrate 11; wherein, the main body part 132 is closer to the base substrate 11 than the convex 131, and the main body part 132 and the convex 131 are formed integrally; a top surface of the convex 131 is in the display area of the base substrate 11; and the display component 12 on an edge of the display area of the base substrate 11 extends beyond the convex 131.

The display component 12 may include: a flatten layer 121, a pixel defining layer 122 for defining a pixel unit disposed on the flatten layer 121, and a post spacer layer 123 disposed on the pixel defining layer 122; an anode 124, a cathode 125 and an organic electroluminescent unit 126 between the anode 124 and the cathode 125 are disposed in each pixel unit.

When dry etching the interlayer insulating layer 154 in the thin film transistor 15, process conditions used may be for example as follows: power: 800 to 1500 W, pressure: 800 to 1200 mtorr, $SF_6$: 30 to 260 sccm, $Cl_2$: 10 to 80 sccm, He: 0 to 20 sccm, and duration: 200 to 700 s.

In a direction perpendicular to the base substrate 11, a distance between a tip of the display component 12 extending beyond the convex 131 and a closest film layer on a side of the display component 12 close to the base substrate 11 is greater than a sum of thicknesses of all inorganic films 141 to be formed.

Figure 8C:
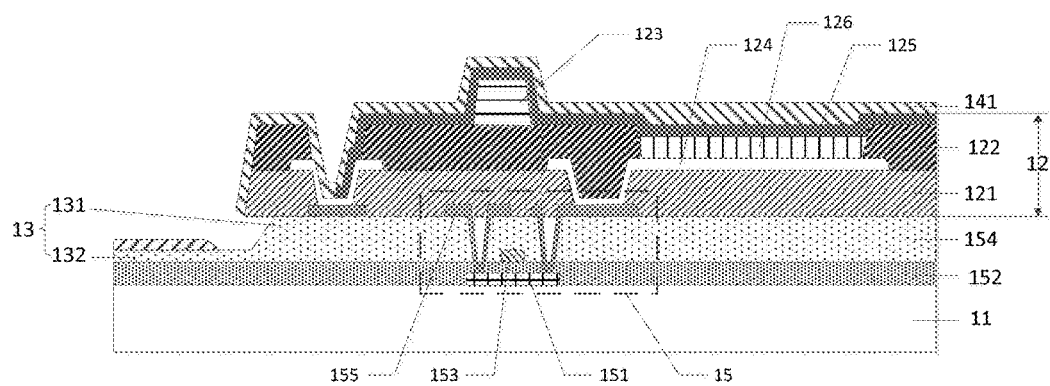

Step III: as shown in FIG. 8c, depositing a layer of inorganic film 141 on the entire base substrate 11, the inorganic film 141 being broken at the tip of the display component 12 extending beyond the convex 131.

Figure 8D:
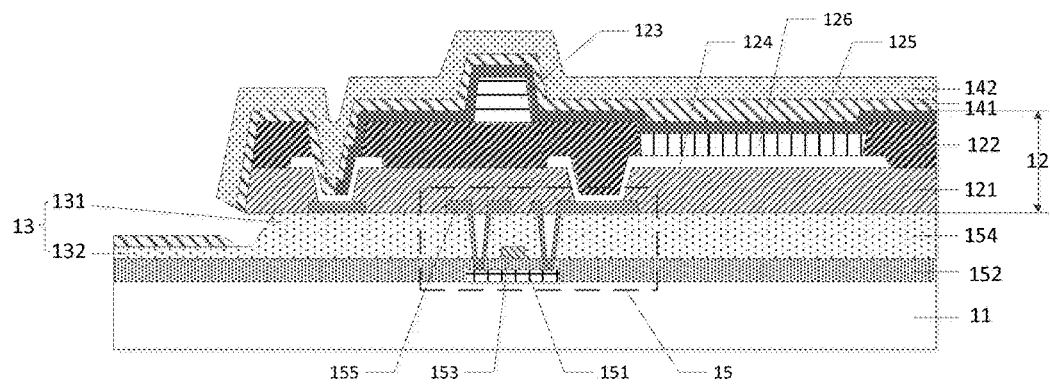

Step IV: as shown in FIG. 8d, printing an organic film 142 on the inorganic film 141.

Step V: as shown in FIG. 4, depositing a layer of inorganic film 141 on the entire base substrate 11, the inorganic film 141 being broken at the tip of the display component 12 extending beyond the convex 131.

Based on the same concept, an embodiment of the present disclosure further provides a display device including the organic electroluminescent display panel provided in any embodiment of the present disclosure. The display device may be any product or component having a displaying function such as mobile phone, tablet computer, television, display, notebook, digital photo frame, navigator and the like.

In conclusion, in the technical solutions provided in the embodiments of the present disclosure, an etching layer including at least a convex with a narrow upper portion and a wide upper portion is disposed between a base substrate and a plurality of display components, wherein a top surface of the convex is in an display area of the base substrate, a display component on an edge of the display area of the base substrate extends beyond the convex, and an inorganic film of a thin film encapsulation structure is configured to be broken at a tip of the display component extending beyond the convex. As such, the inorganic film crack generated during the cutting or transportation of an OLED display panel can be prevented from propagating to the display area, and the failure of the display component due to the influence of water and oxygen can be avoided, which improves the reliability of the product.

Obviously, various modifications and variations on the present application can be made by those skilled in the art without departing from the spirit and scope of the present application. As such, if these modifications and variations on the present application fall within the scopes of the claims of the present application or equivalent technologies thereof, the present application is intended to encompass these modifications and variations.

What is claimed is:

1. An organic electroluminescent display panel comprising:
    a base substrate,
    a plurality of display components on a display area of the base substrate,
    an etching layer between the base substrate and the plurality of display components, and
    a thin film encapsulation structure covering the display area and a peripheral area of the base substrate;
    wherein the etching layer comprises:
        a convex with a narrow upper portion and a wide lower portion, a top surface of the convex being in the display area of the base substrate; and
        a display component on an edge of the display area of the base substrate that extends beyond the convex; and wherein the thin film encapsulation structure comprises at least one layer of inorganic film and at least one layer of organic film disposed alternatively, wherein the organic film only covers the plurality of display components, and the inorganic film covers the entire base substrate, but is broken at a tip of the display component extending beyond the convex.

2. The organic electroluminescent display panel according to claim 1, wherein, in a direction perpendicular to the base substrate, a distance between the tip of the display component extending beyond the convex and a closest film layer on a side of the display component close to the base substrate is greater than a sum of thicknesses of all inorganic films.

3. The organic electroluminescent display panel according to claim 1, wherein a shortest distance between the convex and an edge of the base substrate is not less than a distance between the tip of the display component extending beyond the convex and the edge of the base substrate.

4. The organic electroluminescent display panel according to claim 1, wherein the etching layer further comprises a main body part covering the entire base substrate, and wherein the main body part is closer to the base substrate than the convex.

5. The organic electroluminescent display panel according to claim 4, wherein the main body part and the convex are formed integrally.

6. The organic electroluminescent display panel according to claim 1, further comprising: a thin film transistor between the base substrate and the plurality of display components, wherein an electrode in the display components is connected to the thin film transistor, and an insulating layer in the thin film transistor is also used as the etching layer.

7. The organic electroluminescent display panel according to claim 6, wherein the thin film transistor comprises: an active layer, a gate electrode insulating layer, a gate electrode, an interlayer insulating layer, and source/drain electrodes sequentially disposed on the base substrate; wherein the interlayer insulating layer is also used as the etching layer.

8. The organic electroluminescent display panel according to claim 6, wherein the thin film transistor comprises: an active layer, a gate electrode insulating layer, a gate electrode, an interlayer insulating layer, and source/drain electrodes sequentially disposed on the base substrate; wherein the interlayer insulating layer and the gate electrode insulating layer are also used as the etching layer.

9. The organic electroluminescent display panel according to claim 1, wherein the plurality of display components comprise a flatten layer, and a pixel defining layer and a pixel unit on the flatten layer, wherein the pixel unit comprises an anode, a cathode and an organic electroluminescent unit between the anode and the cathode.

10. The organic electroluminescent display panel according to claim 9, wherein the plurality of display components further comprise a post spacer layer on the pixel defining layer.

11. A display device comprising the organic electroluminescent display panel according to claim 1.

12. A preparation method for the organic electroluminescent display panel according to claim 1, comprising:
forming an etching film on the display area and the peripheral area of the base substrate;
forming the plurality of display components on the etching film in the display area of the base substrate, and after forming a flatten layer in the display components, dry etching the etching film to form an etching layer comprising a convex with a narrow upper portion and a wide lower portion, wherein a top surface of the convex is in the display area of the base substrate, and a display component on an edge of the display area of the base substrate extends beyond the convex; and
forming the thin film encapsulation structure on the display area and the peripheral area of the base substrate.

13. The preparation method according to claim 12, wherein said dry etching the etching film to form the etching layer comprising the convex with the narrow upper portion and the wide lower portion comprises:
dry etching the etching film to form the etching layer comprising the convex with the narrow upper portion and the wide lower portion, such that in a direction perpendicular to the base substrate, a distance between the tip of the display component extending beyond the convex and a closest film layer on a side of the display component close to the base substrate is greater than a sum of thicknesses of all inorganic films.

14. The preparation method according to claim 12, wherein, said dry etching the etching film to form the etching layer comprising the convex with the narrow upper portion and the wide lower portion comprises:
dry etching the etching film to form the etching layer comprising the convex with the narrow upper portion and the wide lower portion and a main body part covering the entire base substrate; wherein the main body part is closer to the base substrate than the convex, and the main body part and the convex are formed integrally.

15. The preparation method according to claim 12, wherein, said after forming the flatten layer in the display components, dry etching the etching film to form the etching layer comprising the convex with the narrow upper portion and the wide lower portion comprises:
after forming a post spacer layer in the display components, dry etching the etching film with the post spacer layer as a mask to form the etching layer comprising the convex with the narrow upper portion and the wide lower portion.

16. The preparation method according to claim 12, further comprising: forming a thin film transistor between the base substrate and the plurality of display components, wherein an electrode in the display components is connected to the thin film transistor, and an insulating layer in the thin film transistor is also used as the etching layer.

17. The preparation method according to claim 16, wherein, the thin film transistor comprises: an active layer, a gate electrode insulating layer, a gate electrode, an interlayer insulating layer, and source/drain electrodes sequentially disposed on the base substrate; wherein the interlayer insulating layer is also used as the etching layer.

18. The preparation method according to claim 16, wherein, the thin film transistor comprises: an active layer, a gate electrode insulating layer, a gate electrode, an interlayer insulating layer, and source/drain electrodes sequentially disposed on the base substrate; wherein the interlayer insulating layer and the gate electrode insulating layer are also used as the etching layer.

19. The preparation method according to claim 12, wherein, process conditions for the dry etching comprises: power: 800 to 1500 W, pressure: 800 to 1200 mtorr, $SF_6$: 30 to 260 sccm, $Cl_2$: 10 to 80 sccm, He: 0 to 20 sccm, and duration: 200 to 700 s.

20. The preparation method according to claim 12, wherein, said forming the thin film encapsulation structure on the display area and the peripheral area of the base substrate comprises:
   forming an inorganic film on the entire base substrate, the inorganic film being broken at a tip of the display component extending beyond the convex; and
   forming an organic layer covering the plurality of display components on the base substrate.

* * * * *